(12) United States Patent
Gaillard et al.

(10) Patent No.: US 6,346,904 B1
(45) Date of Patent: Feb. 12, 2002

(54) ALIASING CIRCUIT AND SERIES INTERPOLATION CELL OF AN ANALOG-DIGITAL CONVERTER USING SUCH A CIRCUIT

(75) Inventors: Christophe Gaillard, Saint Pancrasse; Marc Wingender, Saint Egreve; Stéphane Le Tual, Veurey Voroize, all of (FR)

(73) Assignee: Atmel Grenoble S.A., Saint Egreve (FR)

( * ) Notice: Subject to any disclaimer, the term of this patent is extended or adjusted under 35 U.S.C. 154(b) by 0 days.

(21) Appl. No.: 09/635,765

(22) Filed: Aug. 11, 2000

(30) Foreign Application Priority Data

Aug. 13, 1999 (FR) ............................................ 99 10496

(51) Int. Cl.[7] ................................................ H03M 1/12
(52) U.S. Cl. ..................... 341/155; 341/136; 341/156; 341/158; 341/159
(58) Field of Search ................................ 341/155, 156, 341/158, 159, 161, 166, 136, 558

(56) References Cited

U.S. PATENT DOCUMENTS

| 5,444,447 A | 8/1995 | Wingender | |
|---|---|---|---|
| 5,471,210 A | * 11/1995 | Wingender et al. | 341/156 |
| 6,166,674 A | * 12/2000 | Wingender et al. | 341/156 |
| 6,236,348 B1 | * 5/2001 | Bore et al. | 341/155 |

FOREIGN PATENT DOCUMENTS

| EP | 0 600 788 A1 | 6/1994 |
|---|---|---|
| JP | 7-210615 | 8/1995 |
| WO | WO 92/08288 | 5/1992 |

* cited by examiner

Primary Examiner—Michael Tokar
Assistant Examiner—Lann T. Mai
(74) Attorney, Agent, or Firm—Oblon, Spivak, McClelland, Maier & Neustadt, P.C.

(57) ABSTRACT

A signal aliasing circuit that can be used especially to make a series interpolation cell of an interpolation analog-digital converter comprises two pairs of differential arms powered by one and the same current source connected to a first power supply terminal, each pair comprising two transistors, the transistors of one pair being parallel-connected with the transistors of the other pair. Each group of two parallel-connected transistors is connected by a respective common resistor to a second power supply terminal, the two outputs of the aliasing circuit being the combined collectors of the two groups of parallel-connected transistors. The disclosed device can be applied especially to converters whose architecture comprises what is known as a series interpolation part requiring high precision.

10 Claims, 9 Drawing Sheets

ALIASING CIRCUIT AND SERIES INTERPOLATION CELL OF AN ANALOG-DIGITAL CONVERTER USING SUCH A CIRCUIT

BACKGROUND OF THE INVENTION

The present invention relates to a signal aliasing circuit that can be used especially to make a series interpolation cell for an interpolation analog-digital converter. It can be applied for example to converters whose architecture comprises a part known as a series interpolation part requiring high precision.

A French patent application No. 92 14640 describes an analog-digital converter with a folding or aliasing circuit comprising a series interpolation part. One of the useful features of a folding or aliasing analog-digital converter is that it can be used to economize on comparators in its analog part. In particular, the conversion of the signal does not play a role in the comparison of the real amplitude of this signal with the signals from a series of analog comparators. The conversion bits with successive place values are obtained by simple analog combinations depending on how the amplitude of the signal falls within intervals defined by evenly distributed reference voltages, these intervals being increasingly small as and when the conversion bits approach the least significant bit. Thus, a signal Vin is applied to the input of at least two aliasing circuits whose function is to give signals known as "aliased" signals Vr1, Vr1$b$, Vr2, Vr2$b$ with an amplitude that varies with the amplitude of the input signal Vin according to a periodic function having a substantially sinusoidal shape. The functions Vr1 and Vr1$b$ are in phase opposition. Similarly, the functions Vr2 and Vr2$b$ are in phase opposition. The functions Vr1 and Vr2 for their part are in quadrature. The differences (Vr1−Vr1$b$), (Vr2−Vr2$b$) periodically cancel each other out for input voltage values that are the above-mentioned reference voltages. From these differences, an interpolation cell sets up signals that have the same general form as the signals set up from the differences in aliased signals, but get cancelled out for input voltage values that are in between the above-mentioned reference voltages. Thus, if an interpolation cell comprises $2^n+1$ reference voltages as described here above at input, it has $2^{n+1}+1$ voltages known as interpolation voltages. A cell therefore enables the creation of an additional information bit. From an initial aliasing circuit, the cascade-connected interpolation cells therefore give the different successive bits corresponding to the conversion of an analog variable, starting with the most significant bit. The interpolation cells are conventionally the cells known as "Gilbert multiplier" cells described especially in the above-mentioned French patent application as well as in the international application WO 92/08288.

The above short description of an analog-digital converter with aliasing circuit shows how important it is for the reference voltages to be precise. Now, these voltages are obtained in interpolation circuits comprising signal aliasing circuits, especially Gilbert cells, whose principle of operation is based on current shunt operations in pairs of differential arms comprising bipolar transistors or MOS type transistors that are cascade-cabled. In this architecture, it follows that the reference voltages depend especially on the base-emitter voltages Vbe of cascade-connected transistors. This voltage itself depends on the current of the transistors and other external parameters such as for example the temperature. The precision of the reference voltages and therefore the result of the analog-digital conversion is thereby affected. Furthermore, for a given peak voltage, the cascade of voltages Vbe limits the useful voltage, namely the voltage available for the conversion.

SUMMARY OF THE INVENTION

The aim of the invention to overcome the above-mentioned drawbacks by limiting the number of cascaded base-emitter voltages Vbe in the signal aliasing circuit of an interpolation cell. To this end, an object of the invention is a signal aliasing circuit comprising two pairs of differential arms powered by one and the same current source connected to a first power supply terminal, each pair comprising two transistors, the transistors of one pair being parallel-connected with the transistors of the other pair, each group of two parallel-connected transistors being connected by a respective common resistor to a second power supply terminal, the two outputs of the aliasing circuit being the combined collectors of the two groups of parallel-connected transistors.

An object of the invention is also a signal aliasing cell designed to receive four voltages varying as a function of an analog signal Vin, the functions varying as a function of Vin in phase opposition, two by two, and in phase quadrature, two by two, this cell giving at least two aliased output signals varying in phase opposition and having more aliasings than the input voltages for one and the same variation of Vin, the output signal combining the references of the input signals. The cell comprises an aliasing circuit as defined here above wherein the bases of the four transistors receive the four voltages varying as a function of the analog signal Vin.

Yet another object of the invention is an interpolation cell for an interpolation analog-digital converter using cells as defined here above.

The main advantage of the invention is that it increases the conversion speed, raises performance in speed, especially that of the analog-digital converter, without in any way significantly increasing the supply voltages, improves these speed performance characteristics in a simple way, and is simple to implement.

BRIEF DESCRIPTION OF THE DRAWINGS

Other features and advantages of the invention shall appear from the following description made with reference to the appended figures, of which:

FIGS. 2$a$ and 2$b$ show exemplary aliased waveforms at input and output of an interpolation cell;

MORE DETAILED DESCRIPTION

Figure 1:
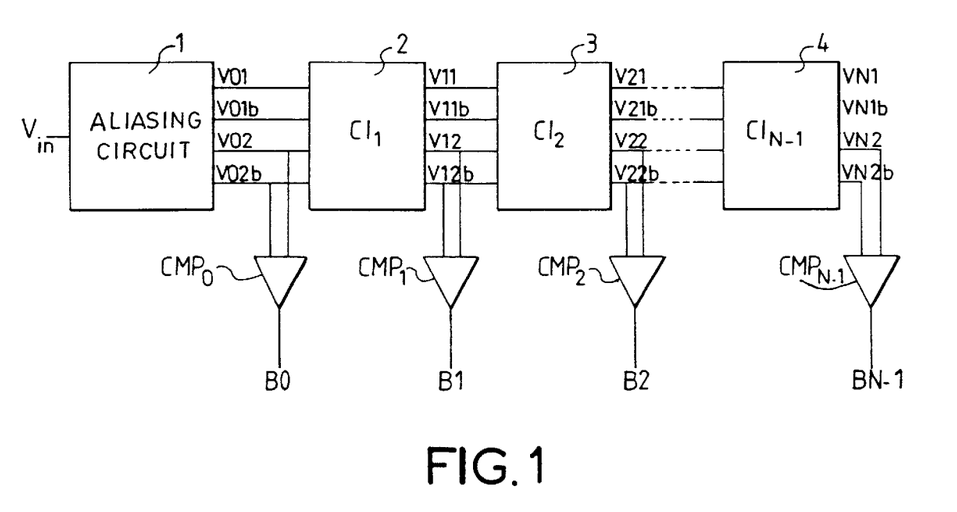
FIG. 1 shows an exemplary architecture of an analog-digital converter with interpolation cells using aliasing circuits.

FIG. 1 shows a schematic view of an exemplary architecture of an analog-digital converter with aliasing circuit. The voltage to be converted Vin is presented at the input of a first aliasing circuit 1. For reasons of clarity of description, circuits not directly related to the object of the invention have not been shown in FIG. 1. This is the case for example of the sample-and-hold device generally placed at the input of an analog-digital converter. The outputs of the converter are represented by bits $B_0$, $B_1$, $B_2$, ..., $B_N$ having the value 0 or 1, the converter encoding the analog variables on N+1 bits. It may be recalled that the result of the digital conversion approaches, for example, the input analog variable Vin according to the following relationship in the case of a natural binary code:

$$Vin = A_0(B_0 2^{-1} + B_1 2^{-2} + B_2 2^{-3} + \ldots B_N 2^{-(N+1)}) \quad (1)$$

where $A_0$ shows the maximum possible amplitude of a signal to be converted.

In other cases, the progression can be done in GRAY code. There is then a decoding of the GRAY code into a binary code.

The bits $B_0$, $B_1$, $B_2$, ..., $B_N$ respectively come from comparators $CMP_0$, $CMP_1$, $CMP_2$, ..., $CMP_N$. It must be noted that, at output of the first aliasing circuit 1, at the front end, it is possible to have several information bits. This depends especially on the number of aliasings or again on the number of references.

The most significant bit $B_0$ is obtained at output of a first comparator $CMP_0$ which is itself wired at output of the aliasing circuit 1 mentioned here above. This circuit, using the input analog voltage Vin, obtains four aliased voltages $V_{01}$, $V_{01b}$, $V_{02}$, $V_{02b}$ given by the four outputs.

Figure 2A:
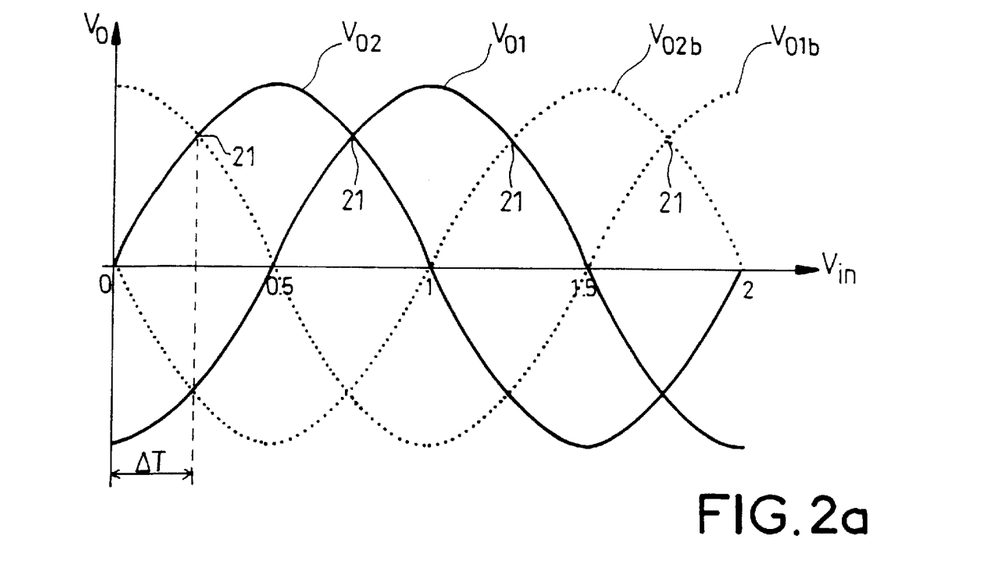

FIG. 2a uses four curves to illustrate the above-mentioned four aliased voltages $V_{01}$, $V_{01b}$, $V_{02}$, $V_{02b}$ in a system of axes. More specifically, the curves representing FIG. 2a illustrate the transfer functions between the input Vin of the aliasing circuit 1 and each of its four outputs. In other words, with the X-axis showing the input voltage Vin, the Y-axis shows the voltage $V_0$ present at each of the four outputs of the circuit 1 as a function of the input voltage Vin. Each of the four curves $V_{01}$, $V_{01b}$, $V_{02}$, $V_{02b}$ then respectively represents the variations of the aliased voltages $V_{01}$, $V_{01b}$, $V_{02}$, $V_{02b}$ as a function of the input voltage Vin, these representative curves having the same reference as their associated voltages for reasons of simplicity. The variations of the aliased voltages $V_{01}$, $V_{01b}$, $V_{02}$, $V_{02b}$ are periodical and have a substantially sinusoidal shape. A period represents the range of conversion or again the maximum permissible amplitude at input of the converter, i.e. especially the value $A_0$ of the relationship (1) above, should the first aliasing circuit 1 have five references, namely two information bits. This is represented in terms of relative value on the X-axis of FIG. 2a by the value 2. The curves $V_{01}$ and $V_{01b}$ are in phase opposition. Similarly, the curves $V_{02}$ and $V_{02b}$ are in phase opposition. The curves $V_{01}$ and $V_{02}$ are in quadrature, $V_{02}$ being in the lead with respect to $V_{01}$ and passing through the starting point 0.

The curves $V_{02}$, $V_{02b}$ determine the most significant bit $B_0$, the latter being equal to 1 if the input voltage Vin is higher than or equal to $A_0/2$ represented by the relative value 1 on the X-axis of FIG. 2a or equal to 0 if it is below this value. To this end, the outputs of the aliasing circuit 1 which comprise the voltages $V_{02}$, $V_{02b}$ are connected to the inputs of the first logic comparator $CMP_0$ in such a way that the output of this logic comparator is equal to 1 when $V_{02}$ is higher than or equal to $V_{02b}$ and is equal to 0 when this is not the case The curves $V_{01}$, $V_{01b}$ form an information bit by themselves in GRAY code. The four outputs of the first aliasing circuit 1 are connected to the four inputs of the second aliasing circuit 2. In a known way, the second aliasing circuit 2 performs an additional aliasing of the input voltage Vin as is shown by four representative curves $V_{11}$, $V_{11b}$, $V_{12}$, $V_{12b}$ in FIG. 2b in a same axial system as the one of FIG. 2a. It therefore gives four aliased voltages $V_{11}$, $V_{11b}$, $V_{12}$, $V_{12b}$ at output. These voltages are designed to be connected by wiring to another aliasing circuit 3, and two of them are designed to give the value of the next significant bits $B_1$. The aliasing circuits 2, 3, 4 which follow the first aliasing circuit 1 and are designed to be cascade-connected are therefore called interpolation cells. The curves $V_{11}$, $V_{11b}$, $V_{12}$, $V_{12b}$, which represent variations of the output voltages of the interpolation cell 2 as a function at the input voltage Vin, are periodic with a period that is half the period of the preceding curves $V_{01}$, $V_{01b}$, $V_{02}$, $V_{02b}$ and are substantially sinusoidal. The curves $V_{11}$ and $V_{11b}$ are in phase opposition. Similarly, the curves, $V_{12}$ and $V_{12b}$ in phase opposition. The curves $V_{11}$ and $V_{12}$ are in quadrature, $V_{12}$ being in advance with respect to $V_{11}$ and going through the starting point 0.

The bit $B_1$ which immediately follows the most significant bit $B_0$ is thus obtained at output of the second comparator $CMP_1$. This comparator is wired to the output of the second aliasing circuit 2 in such a way that the bit $B_1$ is equal to 1 when $V_{12}$ is equal to $V_{12b}$ or is equal to 0 when this is not the case.

Figure 2B:
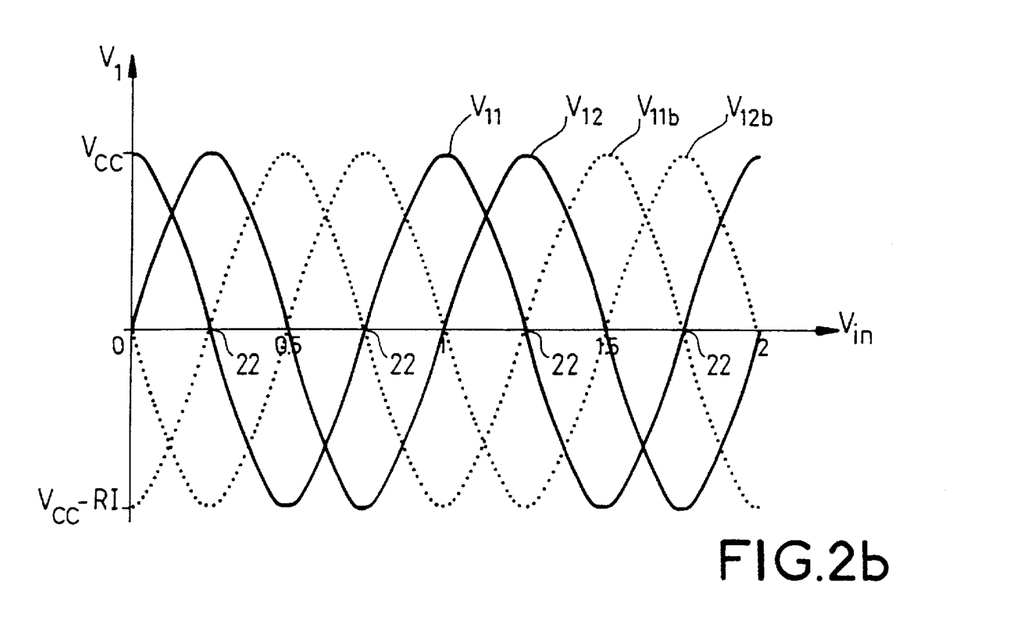

Similarly to the obtaining of $B_1$, the following interpolation circuits 3, 4 and the associated comparators $CMP_1$, ..., $CMP_{N-1}$ make it possible to obtain the following bits $B_2$, ..., $B_N$. An interpolation circuit 2, 3, 4 mounted in a cascade connection performs an aliasing in addition to that of the previous interpolation circuit and thus gives an additional information bit as illustrated in the passage of the bit $B_0$ to the bit $B_1$ as described here above. The intersections of the curves $V_{11}$, $V_{11b}$, $V_{12}$, $V_{12b}$ on the X-axis represent what have been called reference voltages here above. These intersections themselves correspond to the intermediate intersections 21 of the curves $V_{01}$, $V_{01b}$, $V_{02}$, $V_{02b}$ located between the reference values of these curves 0, 0.5, 1, 1.5 and 2.

Depending on whether the input voltage Vin is lower or higher than a reference voltage, the value of the corresponding place value bit $B_1$. in an example pertaining to FIG. 2a is equal to 0 or 1. The precision of these reference voltages is therefore a very important parameter. In particular, it may be important that these reference values should depend as little as possible on parameters beyond control such as the temperature. These reference values are obtained in interpolation cells comprising signal aliasing circuits, especially Gilbert cells, whose principle of operation is based on current shunts in pairs of differential branches comprising cascade-cabled bipolar transistors.

Figure 3:
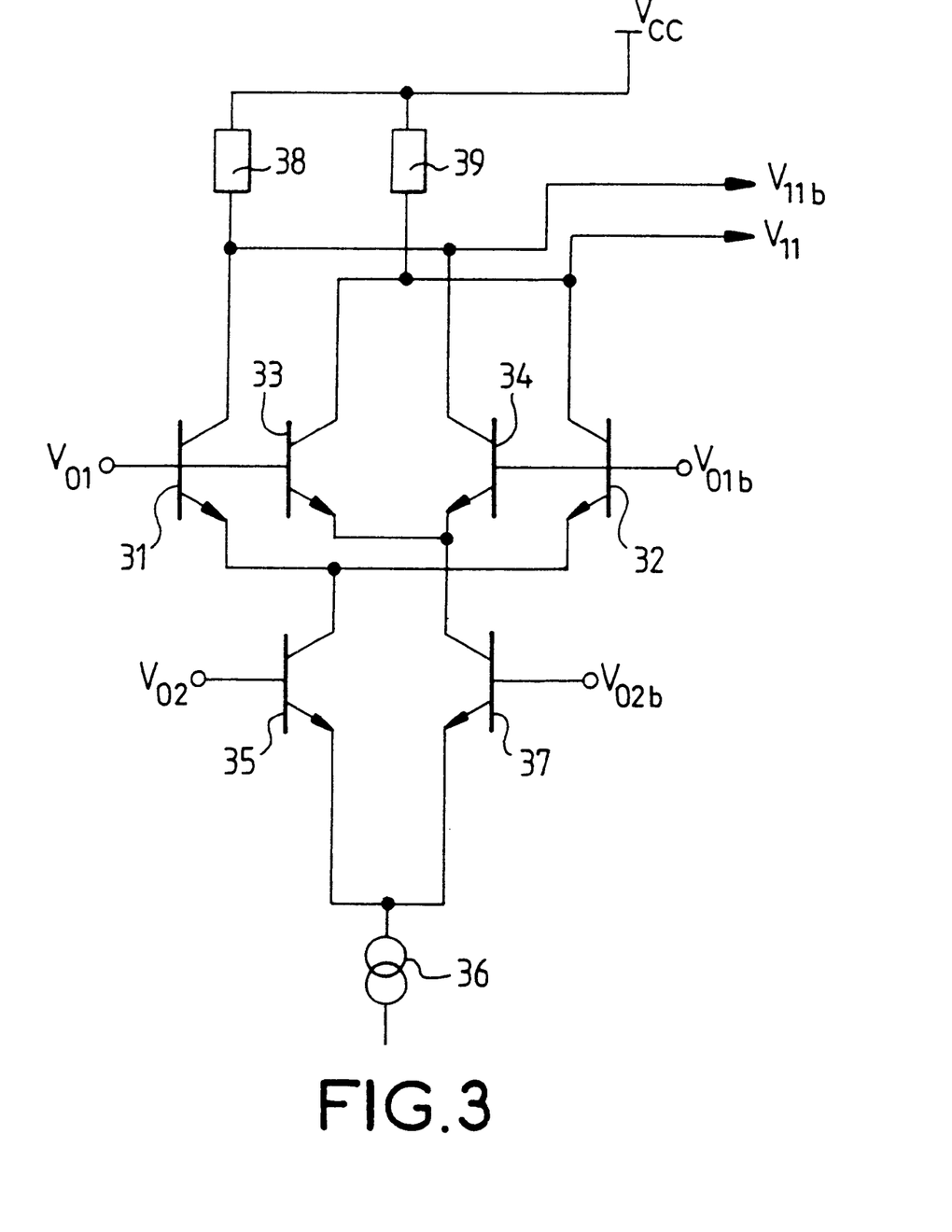
FIG. 3 shows an exemplary prior art aliasing circuit called a Gilbert cell.

FIG. 3 shows a prior art voltage aliasing circuit, for example a Gilbert cell, which can be made furthermore by MOS technology. A circuit of this kind can be used for example to obtain the voltages $V_{12}$ and $V_{12b}$ of FIG. 2b from the four voltages $V_{01}$, $V_{01b}$, $V_{02}$, $V_{02b}$ of FIG. 2a. The circuit of FIG. 3 has two differential pairs 31, 32, 33, 34 formed by NPN bipolar transistors. A first pair 31, 32 is connected by means of a first follower transistor 35 whose base is controlled by the voltage $V_{02}$, to a current source 36 and the second pair 33, 34 is connected to this same source by means of a second follower transistor 37, the base of which is controlled by the voltage $V_{02b}$. The voltage $V_{01}$ is connected to the base of a transistor 31, 33 of each pair. Similarly, the voltage $V_{01b}$ is connected to the base of a transistor 32, 34 of each pair. The connector of the transistor 31 of the first pair is connected with the collector of a transistor 34 of the second pair to a stabilized voltage Vcc by means of a first resistor 38, the collectors of the other two transistors being connected to this same stabilized voltage Vcc by means of a second resistor 39. The linkage point of the first resistor 38 and of the collectors gives for example the voltage $V_{11b}$ and the linkage point of the second resistor and of the collectors gives for example the voltage $V_{11}$. The principle of operation of this circuit may be recalled briefly. During the half-period when the voltage $V_{01}$ is higher than the voltage $V_{01b}$, the current I of the source 36 can only flow through the transistors 31, 33 whose base is controlled by $V_{01}$. In this half-period, a current I flows firstly into the first resistor 38 and into the first follower transistor 35 and secondly into the second resistor 39 and the second follower transistor 37 depending on the relative values of $V_{02}$ and $V_{02b}$. The voltage $V_{11}$ or $V_{11b}$ varies therefore between Vcc–RI, where the current flows into the first resistor 38 and Vcc where the current I flows into the second resistor 39, R being the value common to the two resistors 38, 39 connected to the stabilized voltage Vcc. During the quarter-period when $V_{02}$ is higher than $V_{02b}$, the voltage $V_{12b}$ goes from Vcc to Vcc–RI because the current I goes through the first resistor 38. Then, during the second quarter-period when $V_{02b}$ is higher than $V_{02}$, the voltage $V_{11b}$ builds up from Vcc–RI to Vcc for the current no longer flows through the first resistor 38 but through the second resistor 39. The phenomenon is similar during the half-period when the voltage $V_{01b}$ is higher tan the voltage $V_{01}$, so much so that the voltage $V_{11b}$ develops according to a period half that which governs the variation of $V_{01}$, $V_{01b}$, $V_{02}$, $V_{02b}$. The voltage aliasing is thus done. The voltage $V_{11}$ develops similarly to the voltage $V_{11b}$ but in phase opposition.

An interpolation cell comprises a second aliasing circuit similar to that of FIG. 3 but one where the voltages $V_{01}$, $V_{01b}$, $V_{02}$, $V_{02b}$ are aliased differently to obtain voltages in quadrature $V_{12}$, $V_{12b}$. In FIG. 2b, the extreme voltages Vcc and Vcc–RI have been shown. The starting point of the axes 0 then correspond to the mid-voltage between these two voltages. The reference voltages introduced by an interpolation cell depend on the intersection of the voltage curves aliased at its input $V_{01}$, $V_{01b}$, $V_{02}$, $V_{02b}$.

From the architecture of FIG. 3, it follows that the reference voltages which depend especially on the voltage differences between $V_{01}$, $V_{01b}$, $V_{02}$, $V_{02b}$ therefore depend on the base-emitter voltages Vbe of cascade-connected transistors. The base-emitter voltage Vbe varies especially with the temperature. The precision of the reference voltages and therefore the total position of the analog-digital converter is then affected by this. Furthermore, the double voltage Vbe unnecessarily uses the available voltage between the current source 36 and Vcc. This tends to increase the voltage Vcc. The increasing of this voltage to then preserve a significant voltage range runs counter to a general trend towards reducing the power supply voltages.

Figure 4:
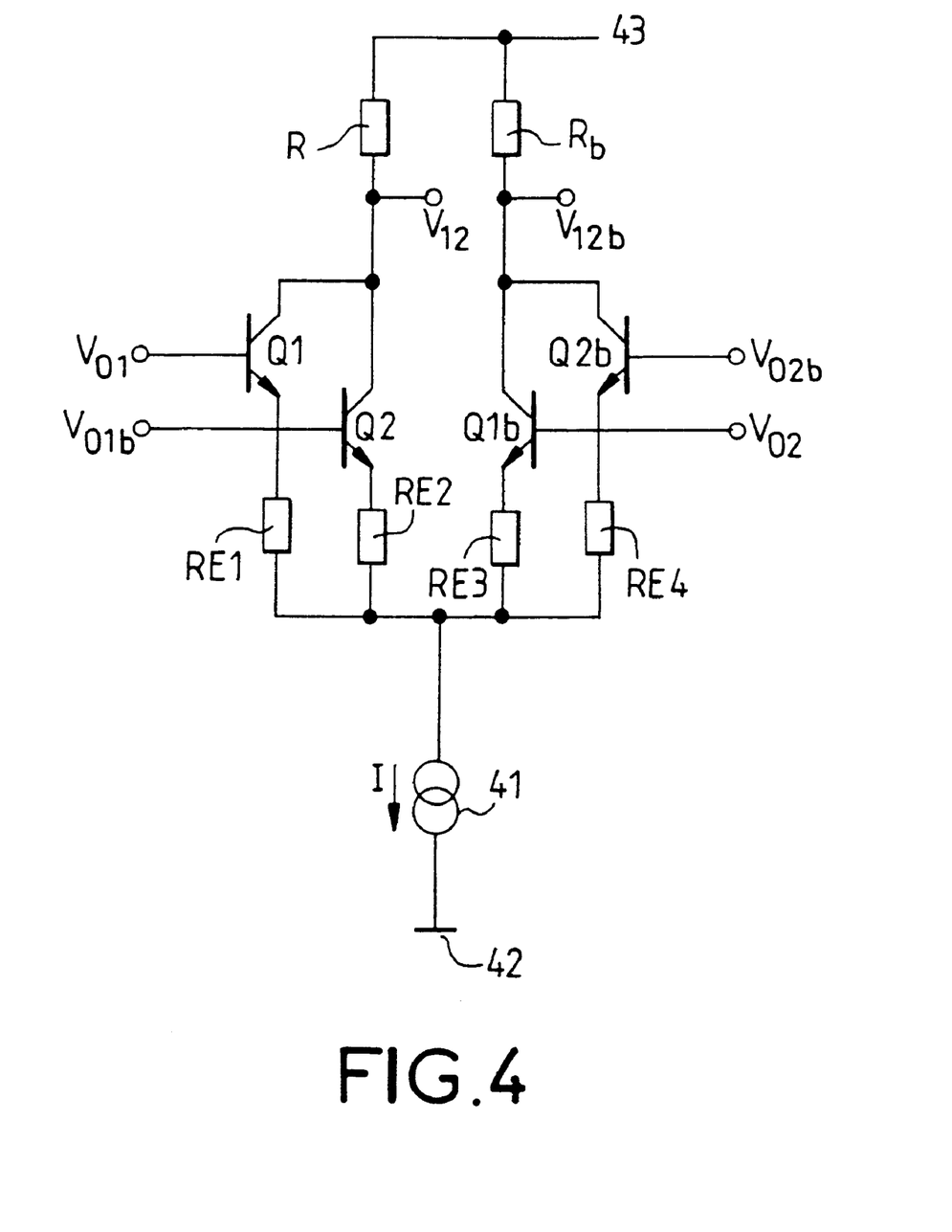
FIG. 4 shows an exemplary possible embodiment of an aliasing circuit according to the invention.

FIG. 4 shows a possible exemplary embodiment of a circuit according to the invention that limits the influence of the base-emitter voltages. This results especially in an improvement in precision but also in a drop in the power supply voltage of the analog-digital converter. This aliasing circuit has two pairs of differential arms powered by one and the same power source 41 connected to a first power supply terminal 42. Each arm has at least one transistor, the transistors of a pair being parallel-connected to the transistors of the other pair. Each group of two parallel-connected transistors is connected by a respective common transistor R, $R_b$ to a second power supply terminal 43, the two outputs $V_{12}$, $V_{12b}$ of the aliasing circuit being the combined collectors of the two parallel-connected groups of transistors. In other words, the collector of a first transistor Q1 is connected with the collector of a second transistor Q2 to the second power supply terminal by means of a first resistor R. Similarly, the collector of a third transistor Q1b is connected with the collector of a fourth transistor Q2b to the second power supply terminal by means of a second resistor $R_b$. The emitters of these four transistors are connected to the current source 41. A first output $V_{12}$ is the linkage point of the collectors and of the first resistor R and the second output $V_{12b}$ is the linkage point of the collectors and the second resistor $R_b$. A first pair of differential arms comprises the transistors Q1 and Q2, and the second pair of differential arms comprises the transistors Q2 and Q1b. An emitter resistor RE1, RE2, RE3, RE4 is for example wired between each transistor Q1, Q2, Q1b, Q2b and the current source 41. These resistors are used especially to obtain linear waveforms in the vicinity of the intersection 21, in FIG. 2a, of the different curves of aliased voltages $V_{01}$, $V_{01b}$, $V_{02}$, $V_{02b}$, which is a major factor for the precision of the reference voltages defined by these intersections 21. It is indeed important that these curves should intersect at levels where they have a sufficiently high gain.

To simplify the representation, the voltages $V_{01}$, $V_{01b}$, $V_{02}$, $V_{02b}$ have been placed directly at the inputs of the aliasing circuit of FIG. 4. In fact, to provide for the efficient functioning of the circuit, follower devices are for example interposed between the voltages $V_{01}$, $V_{01b}$, $V_{02}$, $VO_{2b}$ and the inputs of the circuit, especially for reasons of impedance matching and also for common mode aspects. These devices are for example transistors mounted in a known way as voltage followers. The voltage drop introduced by these followers is neutralized especially by the symmetry of the assembly.

The working of the circuit of FIG. 4 may be explained with reference to FIGS. 2a and 2b. Starting, for example, with four waveforms $V_{01}$, $V_{01b}$, $V_{02}$, $V_{02b}$ as illustrated by FIG. 2a, this circuit gives the waveforms $V_{11}$, $V_{11b}$ of FIG. 2b. These two waveforms are said to be offset because their reference values which correspond to their intersections 22 on the X-axis, are offset with respect to the reference values produced by the waveforms of FIG. 2a. The reference values of the two waveforms $V_{11}$, $V_{11b}$ of FIG. 2b correspond actually to the intermediate intersections 21 of the waveforms of FIG. 2a. If we look at this figure, from the reference value 0 to the first intermediate intersection point 21, when $V_{01b}$ is higher than the other voltages, the current I of the current source 41 goes into the transistor Q2 controlled by $V_{01b}$. Then, in accordance with the relative values of the voltages between the first intermediate intersection point 21 and the reference value 1, the current I passes successively into the transistor Q1b controlled by $V_{02}$ up to the intermediate intersection between the reference value 0.5 and 1 and then finally through the transistor Q1 controlled by $V_{01}$ from this intersection point up to the value 1.

Figure 5:
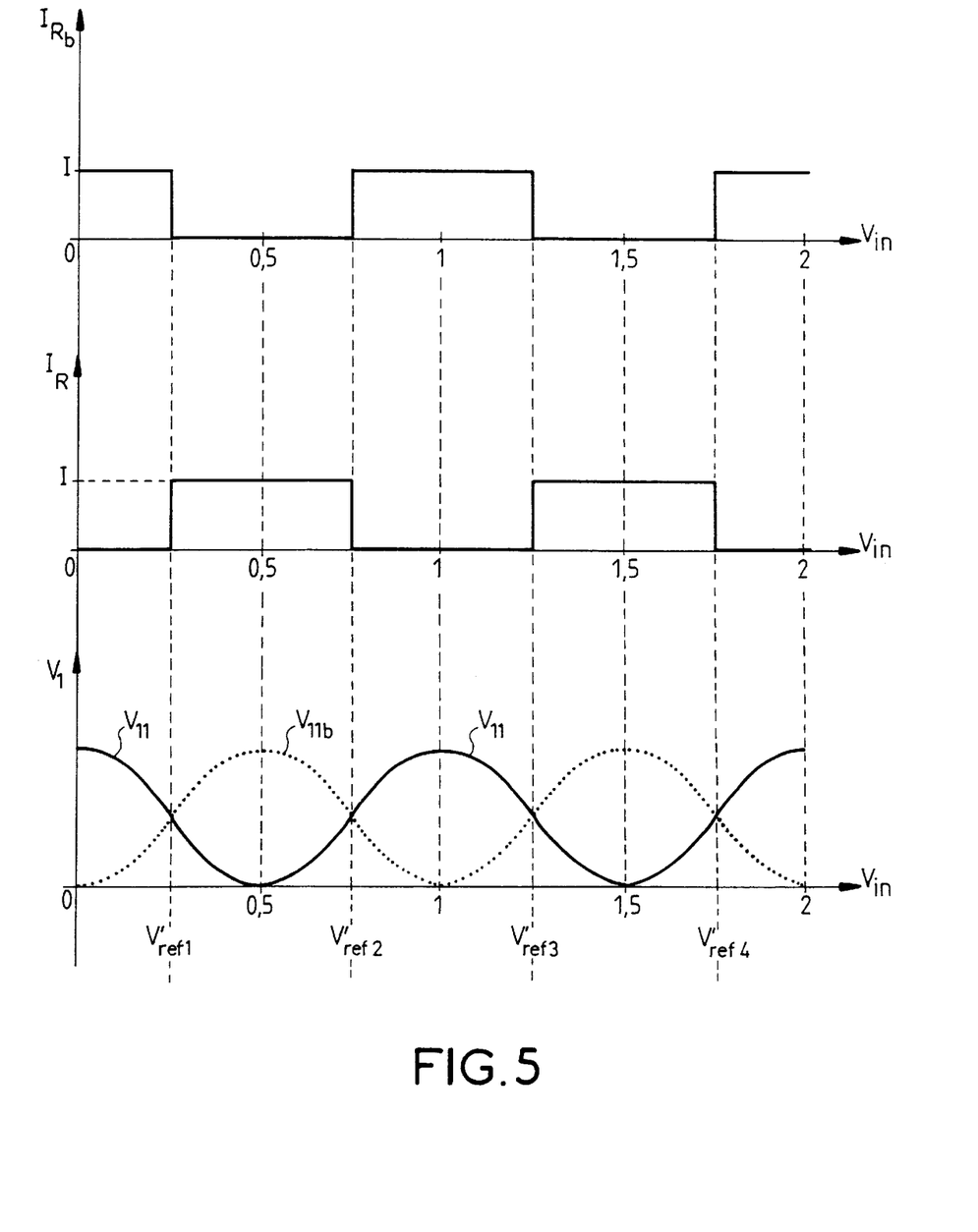
FIG. 5 illustrates the operation of an aliasing circuit according to the invention having, as a function of an input voltage Vin, the waveforms of currents flowing in collector resistors and the waveforms of the output voltages.

FIG. 5a thus illustrates the corresponding passage in the resistors R and $R_b$, which have the same ohmic value. The current waveforms of the resistors R and $R_b$, respectively referenced $I_R$ and $I_{Rb}$, are given in two respective axial systems as a function of the relative values of the input voltage Vin. Thus, from 0 to the first intermediate intersection point 21, the current I goes into the resistor $R_b$ and not into the resistor R. Then, up to the intermediate point of intersection 21 ranging from 0.5 to 1, the current I goes into the resistor R and not into the resistor $R_b$. Finally, from this intermediate point 21 up to the reference value 1, the current I flows into the resistor $R_b$ and not into the resistor R.

Similarly, the working of the circuit can be explained during the following half period, namely between the relative reference values 1 and 2 of FIG. 2a. From the relative value 1 to the next intermediate intersection point 21, it is always the transistor Q1 that conducts the current I because it has the highest basic voltage, $V_{01}$. The resistor $R_b$ therefore continues to conduct the current up to this intermediate point, while the resistor R remains without current. Then, up to the point of intersection between the reference values 1,5 and 1, the transistor Q2b conducts the current having the highest basic voltage, $V_{02b}$. It is then the resistor R that is crossed by the current I. Finally, up till the value 2, the transistor Q1b, controlled by the voltage $V_{01b}$ which again becomes the highest voltage, again conducts the current I, which then goes again into the resistor $R_b$.

The waveforms at the outputs are illustrated in a third system of axes in FIG. 5. When the resistor R becomes conductive, the output voltage $V_{11}$ goes from the voltage Vcc, present at the terminal 43, to the voltage Vcc–RI, while the output voltage $V_{11b}$ goes from Vcc–RI to Vcc. The waveforms $V_{11}$ and $V_{11b}$ are then truly in phase opposition and intersect at values $V'_{ref1}$, $V'_{ref2}$, $V'_{ref3}$, $V'_{ref4}$ each equidistant from the reference values 0, 0,5, 1, 1.5 and 2 of FIG. 2a that surround them, provided that these intersections occur at the places where these curves are linear. This may be obtained by playing especially on the values of the emitter resistors RE1, RE2, RE3, RE4. The above-mentioned values $V'_{ref1}$, $V'_{ref2}$, $V'_{ref3}$, $V'_{ref4}$ constitute new reference values created by the aliasing circuit of FIG. 4. This circuit has been described for the aliasing of the voltages $V_{01}$, $V_{01b}$, $V_{02}$, $V_{02b}$. It works of course for the aliasing of all higher-order waveforms, especially in a cascade of interpolation cells in an analog-digital converter.

A circuit according to the invention, as illustrated in FIG. 4, can be used, through the aliasing of the waveforms $V_{01}$, $V_{01b}$, $V_{02}$, $V_{02b}$, to obtain what were previously called the offset aliased voltages $V_{11}$ and $V_{11b}$. To make a series interpolation cell as defined with respect to FIG. 1, it is necessary to add another circuit to the aliasing circuit of FIG. 4. This other circuit will give the aliased voltages $V_{12}$ and $V_{12b}$, which may be called direct alias voltages. To this end, it is possible, for example, to add to the circuit of FIG. 4 another identical circuit, provided with a complementary assembly used to obtain waveforms in quadrature, $V_{12}$ and $V_{12b}$.

Figure 6:
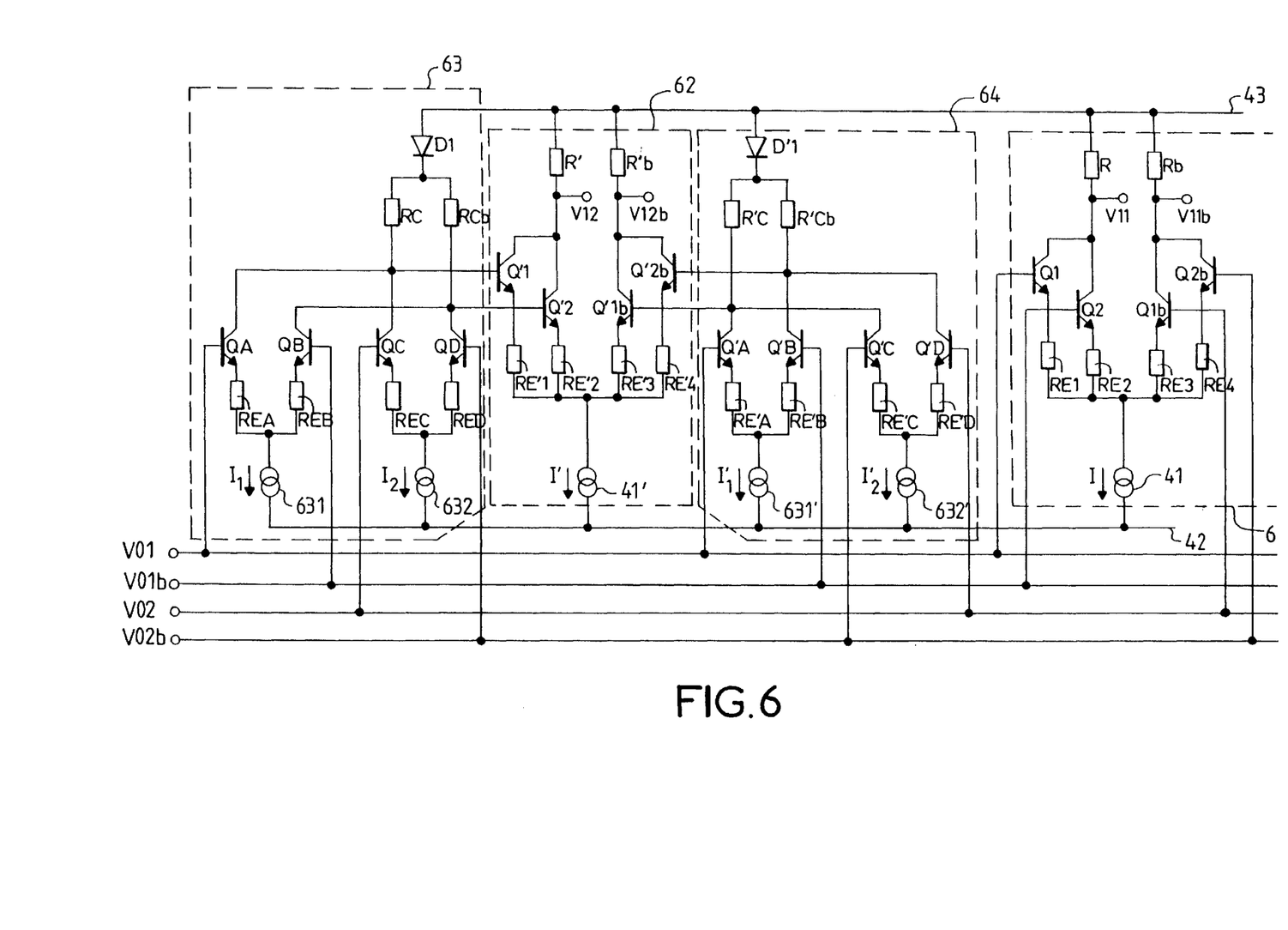
FIG. 6 shows an exemplary possible embodiment of an interpolation cell according to the invention.

FIG. 6 shows an exemplary possible embodiment of an interpolation cell provided with two aliasing circuits according to the invention. This cell therefore has a circuit 61 identical to that of FIG. 4. At its inputs, it receives the voltages $V_{01}$, $V_{01b}$, $V_{02}$, $V_{02b}$ as described with respect to this figure. In other words, the voltages $V_{01}$ are supplied to the base of the transistor Q1, the voltages $V_{01b}$ are supplied to the base of the transistor Q2, the voltages $V_{02}$ are supplied to the base of the transistor Q1b and the voltages $V_{02b}$ are supplied to the base of the transistor Q2b. The cells have a second circuit 62 such as that of FIG. 4, comprising the same elements as the previous one 61. These elements, whose functional characteristics may nevertheless be different, have the same references, but these references are distinguished by the sign <'>.

Unlike the circuit 61 which gives the offset aliased voltages $V_{11}$, and $V_{11b}$, the circuit 62 which gives the forward aliased voltages $V_{12}$ and $V_{12b}$ at its two outputs, does not directly receive the voltages $V_{01}$, $V_{01b}$, $V_{02}$, $V_{02b}$. Thus, at its four inputs, the aliasing circuit 62 receives the two outputs of a first current combination circuit 63 and the two outputs of a second current combination circuit 64. Each current combination circuit comprises, for example, two differential pairs. Each differential pair is powered by a respective current source 631, 632, 631', 632' and has common collector resistors Rc, $Rc_b$, R'c, $R'c_b$. Again, for each current combination circuit 63, 64, one pair receives the voltages $V_{01}$, and $V_{01b}$ as inputs and the other pair receives the voltages $V_{02}$ and $V_{02b}$ as inputs. The two outputs of a current combination circuit are taken at the collector resistors Rc, $Rc_b$, R'c, $R'c_b$.

More specifically, a current combination circuit 63 comprises a first transistor QA, a second transistor QB, a third transistor QC and a fourth transistor QD, the first two transistors QA, QB forming the first differential pair and the other two transistors QC, QD forming the second differential pair. The collectors of the first transistor QA and of the third transistor QC are connected to the first resistor Rc, while the collectors of the second and third transistors QB, QD are connected to the second resistor $Rc_b$. The emitters of the first two transistors QA, QB are connected to a first current source 631 and the emitters of the other two transistors are connected to the second current source 632. Preferably, to obtain especially signals that are truly linear, the emitters are connected to these current sources 631, 632 by resistors REA, REB, REC, RED. These current sources give, for example, the same current. The connection point of the collectors of the first and third transistors QA, QC and of the resistor Rc forms a first output of the circuit 63, which is for example connected to the base of the transistor Q'1 of the aliasing circuit 62. Similarly, the connection point of the collectors of the other two transistors QB, QD and of the resistor $Rc_b$ forms a second output of the circuit 63, which is connected, for example, to the base of the transistor Q'2 of the aliasing circuit 62. The resistors of the collector Rc, $Rc_b$ are furthermore connected to the potential Vcc, namely to the second terminal 43 mentioned here above. To prevent the saturation of the transistors QA, QB, QC, QD, these transistors Rc, $Rc_b$ are connected for example to this second terminal 43 by means of a diode D1. The voltages $V_{01}$, $V_{01b}$, $V_{02}$, $V_{02b}$ are for example supplied to the bases of the transistors QA, QB, QC, QD. The second current combination circuit 64 comprises the same components as the first circuit 63, these elements being distinguished by the sign <'> in FIG. 6. In particular, the voltages $V_{01}$, $V_{01b}$, $V_{02}$, $V_{02b}$ are respectively supplied, for example, to the bases of the transistors Q'A, Q'B, Q'C, Q'D. Finally, the connection point of the collectors of the first and third transistors Q'A, Q'C and of the resistor R'c forms a first output of the circuit 64, which is connected for example to the base of the transistor Q'2b of the aliasing circuit 62. Similarly, the connection point of the collectors of the other two transistors Q'B, Q'D and of the resistor $R'c_b$ forms a second output of the circuit 64, which is connected, for example, to the base of the transistor Q'1b of the aliasing circuit 62. For reasons of impedance matching in particular, the voltages $V_{01}$, $V_{01b}$, $V_{02}$, $V_{02b}$ are not applied directly to the bases of the transistors of the interpolation cell but, for example, by means of transistors mounted as voltage followers.

Furthermore, diodes (not shown) with an offset function can be used to ensure that the potential references on the first aliasing circuit 61 are the same as on the second aliasing circuit 62, especially to compensate for the base-emitter voltages Vbe of the transistors of the current combination circuits 63, 64.

With regard to the working of the current combination circuits 63, 64, it must be noted that the resistors of collectors Rc, Rc$_b$ convert the current variations produced by the circuit into voltages applicable to the input of the bases of the transistors. One role of the combination circuits 63, 64 especially is to create an offset of the waveforms $V_{01}$, $V_{01b}$, $V_{02}$, $V_{02b}$ before they are fed into the inputs of the aliasing circuit 62. This shift actually corresponds to the variation $\Delta V$ between a reference voltage, for example 0, and the following.intersection point 21. It is also the offset between the offset and direct aliased waveforms. The working of a circuit 63, 64 may be described with reference to FIGS. 2a and 2b, to show for example that the waveform $V_{02}$ is offset on the base of the transistor Q'2 of the second aliasing circuit 62 by an offset $\Delta V$ with respect to its input on the base of the transistor Q2.

Figure 7:
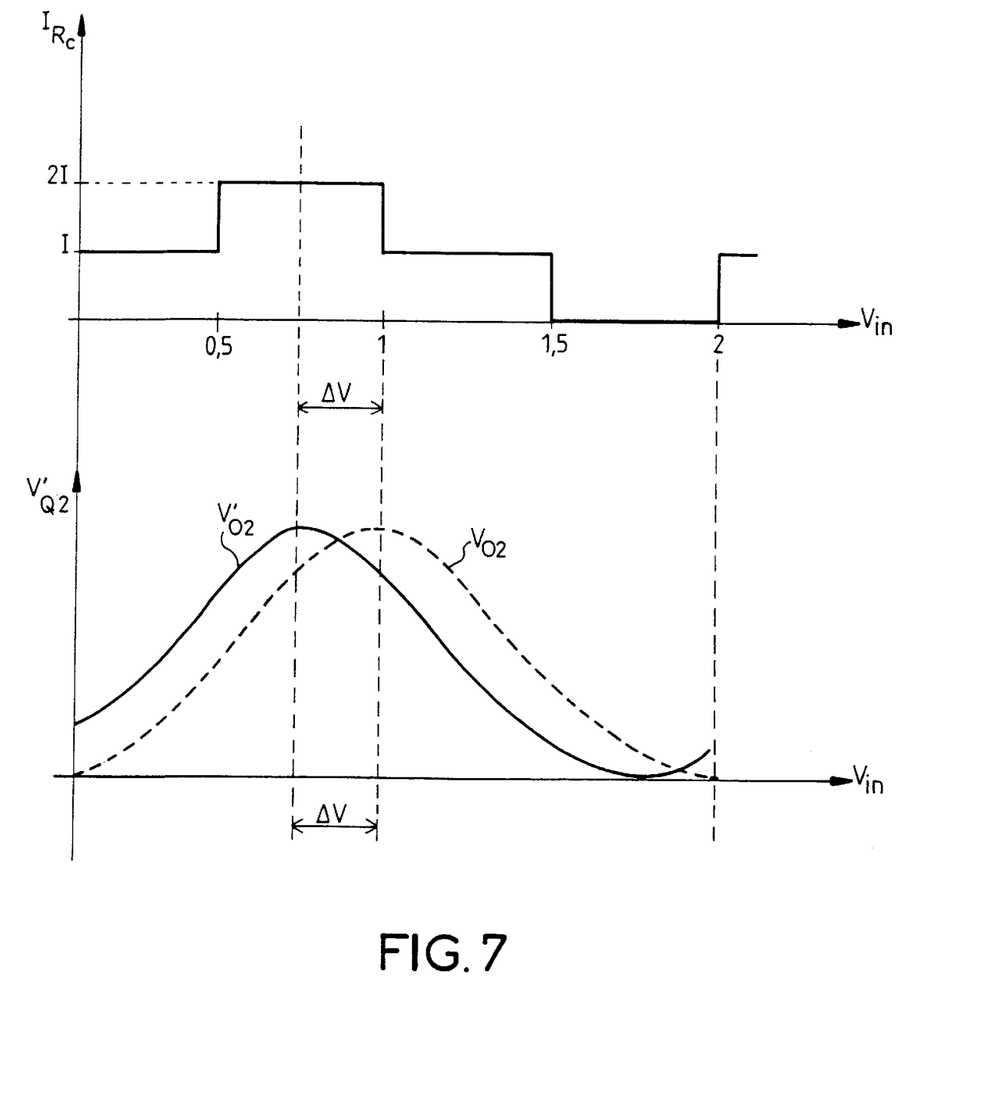
FIG. 7 illustrates the working of a current combination circuit giving an offset of the waveforms at input of an aliasing circuit according to the invention, the figure presenting the collector current waveforms and voltage waveforms in a resistor as a function of the above-mentioned input voltage.

In FIG. 7, two systems of axes are used to show the current $I_{Rc}$ in the resistor Rc and the voltage $V_{Q'2}$ present at the base of the transistor Q'2. A line of dashes recalls the waveform $V_{02}$. The current I1 and I2 of the 631, 632 are identical and are, for example, equal to I. When Vin ranges from 0 to 0.5, the current I1 flows into the transistor QC because the voltage $V_{02}$ that controls this transistor is higher than the voltage $V_{02b}$ that controls the transistor QD, and the current I2 goes into the transistor QB because the voltage $V_{01b}$ that controls this transistor is higher than the voltage $V_{01}$ that controls the transistor QA. The current $I_{Rc}$ which flows into the resistor Rc is therefore equal to I. When Vin is between 0.5 and 1, the current I1 still flows into the transistor QC because the voltage $V_{02}$ which controls this transistor remains higher than the voltage $V_{02b}$ which controls the transistor QD, but the current I2 then goes into the transistor QA because the voltage $V_{01}$ which controls this transistor again becomes higher than the voltage $V_{01b}$ which controls the transistor QB. The current $I_{Rc}$ which flows into the resistor Rc is therefore equal to 2I. By comparing the voltages $V_{01}$, $V_{01b}$, $V_{02}$, $V_{02b}$ with one another, it can easily be shown that that, when Vin ranges from 1 to 1.5, the current $I_{Rc}$ that flows into the resistor Rc is equal to I, and that when Vin ranges from 1.5 to 2, the current $I_{Rc}$ that flows into the resistor Rc is equal to 0. The wave of current $I_{Rc}$ that goes through the collector resistor Rc is periodic and offset by a lead of $\Delta V$ with respect to the waveform $V_{02}$. The waveform $V'_{02}$ generated on the base of the transistor Q'2 of the second aliasing circuit 62 is therefore offset by a lead of $\Delta V$ with respect to the waveform $V_{02}$ present at the input of the transistor Q2 of the first aliasing circuit 61. What has just been described for this waveform $V_{02}$ applies also to the other waveforms $V_{01}$, $V_{01b}$, $V_{02b}$. The aliased waves $V_{12}$ and $V_{12b}$ obtained at output of the second aliasing circuit 62 will therefore be offset, with a lead of $\Delta V$ with respect to the waveforms $V_{11}$ and $V_{11b}$ obtained at output of the aliasing circuit 61. The interpolation cell of FIG. 6 therefore makes it possible to obtain the four aliased voltages $V_{11}$, $V_{11b}$, $V_{12}$, $V_{12b}$. The working of this cell has been described for the obtaining of the voltages $V_{11}$, $V_{11b}$, $V_{12}$, $V_{12b}$ from the voltages $V_{01}$, $V_{01b}$, $V_{02}$, $V_{02b}$. The working is of course the same whatever the order of the aliased waveforms, the reference values 0, 0.5, 1 et 1.5 on which this description is based, being furthermore relative values of the input voltage Vin. These values are thus applicable whatever the order of the aliased voltages. With regard to the linearity of the signals referred to here above, these are portions of signals included between the peaks of the waveforms. This linearity is obtained, for example, by playing on the emitter resistors of the transistors.

The interpolation cell described with reference to FIG. 6 is shown as an example. This cell has a signal aliasing circuit of the kind illustrated by FIG. 4 which gives the offset, aliased waveforms $V_{11}$ and $V_{11b}$. It also has an aliasing cell used to obtain direct waveforms $V_{12}$ and $V_{12b}$. In this cell, the preceding aliasing circuit is complemented by current combination circuits 63, 64 used to make the $\Delta V$ offset to obtain the direct aliased waveforms. It is of course possible to use circuits other than these current combination circuits to obtain this offset.

Figure 8:
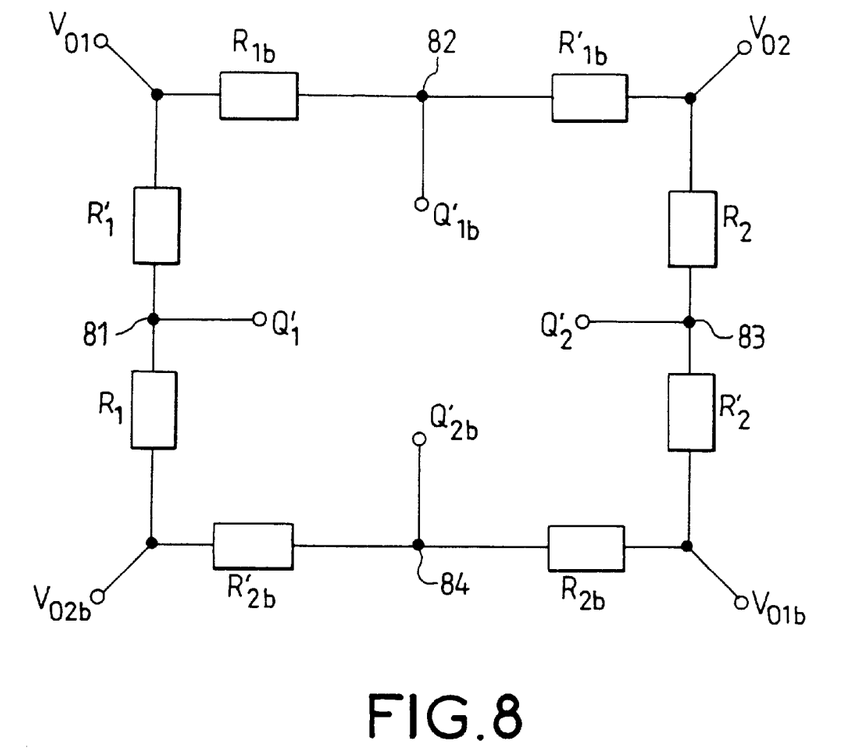
FIG. 8 shows another possible exemplary embodiment of a waveform offset circuit at input of an aliasing circuit according to the invention.

FIG. 8 shows another possible embodiment of an aliasing cell used to obtain direct waveforms. To simplify the explanation, only the shift circuit has been shown. This circuit has, for example, four pairs of resistors R1 and R'1, R1b and R'1b, R2 and R'2, R2b and R'2b. The voltage $V_{01}$ occurs between a first pair R1, R'1 and a second pair R1b, R'1b. The voltage $V_{02}$ occurs between the second pair R1b, R'1b and a third pair R2, R'2. The voltage $V_{01b}$ occurs between the third pair R2, R'2 and a fourth pair R2b, R'2b. The voltage $V_{02b}$ occurs between the fourth pair R2b, R'2b and the first pair R1, R'1. The connection point 81 between the two resistors R1, R'1 of the first pair is connected to the base of the transistor Q'1. The connection point 82 between the two resistors R1b, R'1b of the second pair is connected to the base of the transistor Q'1b. The connection point 83 between the resistors R2, R'2 of the third pair is connected to the base of the transistor Q'2. The connection point 84 between the two resistors R2b, R'2bof the fourth pair is connected to the base of the transistor Q'2b.

Figure 9:
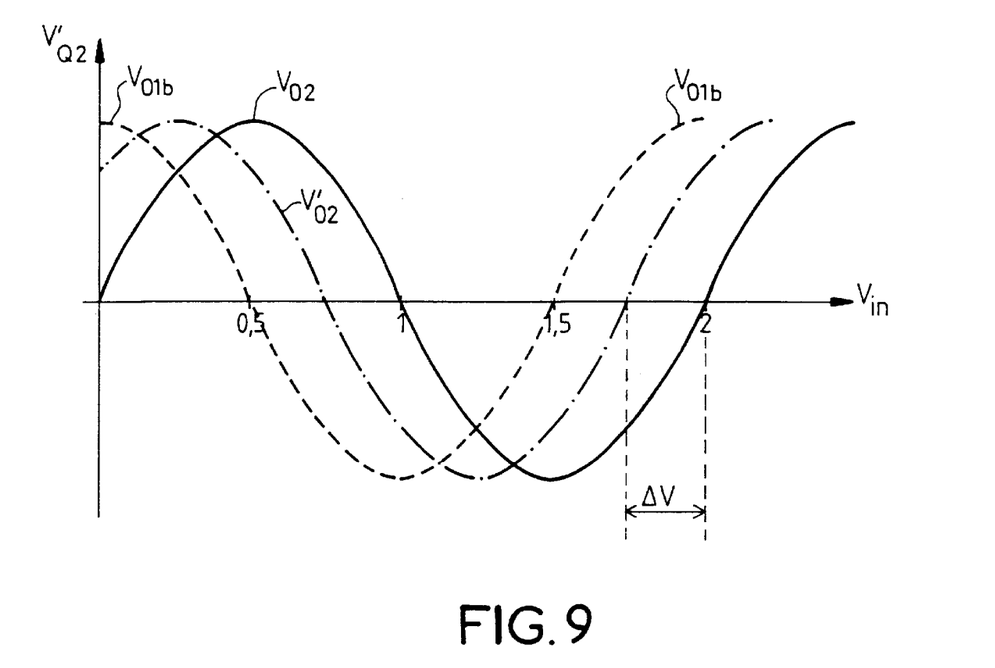
FIG. 9 illustrates the working of the circuit of FIG. 8 showing a waveform offset as a function of the other two waveforms.

FIG. 9 illustrates the working of the assembly in the case of the voltage $V_{02}$ The resistors may for example all have the same value. In this case, the voltage at the point 83 present at the base of the transistor Q'2 is equal to $V'_{02}=(V_{02}+V_{01b})/2$. Referring to the waveforms $V_{01}$, $V_{01b}$, $V_{02}$, $V_{02b}$ as presented in FIG. 2a, a waveform $V'_{02}$ is obtained at this point 83. This waveform $V'_{02}$ is offset with a lead of $\Delta V$ with reference to the voltage $V_{02}$, thus obtaining a result similar to that of the assembly of FIG. 6. The assembly of FIG. 8 has the particular advantage of comprising only passive circuits.

With regard to the technology of the components, the transistors used may, in particular, be NPN or PNP transistors or NMOS or PMOS transistors.

With regard to the speed of a signal aliasing or interpolation cell, it may be characterized by the build-up time of the voltages and the propagation time when the input signals are voltage steps. It is possible to very simply optimize these parameters by accurately sizing the currents, especially in the differential pairs of the current combination circuits 63, 64, for these circuits are advantageously independent for each pair. The speed of operation may be further improved by the addition of cascade-connected structures, known as cascoded structures, in the collectors of the differential pairs. This can be done in a way that is more optimized than in the prior art which already comprises cascade-connected transistors, and therefore requires greater supply voltages. Circuits according to the invention therefore advantageously increase the speed of operation, especially of the analog-digital converters, without in any way significantly increasing the supply voltage of the circuits. Finally, the structures used by the invention are simple. The circuits may therefore easily be implemented and optimized.

What is claimed is:

1. A signal aliasing circuit comprising two pairs of differential arms powered by one and the same current source connected to a first power supply terminal, each pair comprising two transistors, the transistors of one pair being parallel-connected with the transistors of the other pair, each group of two parallel-connected transistors being connected by a respective common resistor to a second power supply terminal, the two outputs of the aliasing circuit being the combined collectors of the two groups of parallel-connected transistors.

2. A signal aliasing circuit according to claim 1, wherein the emitters of the transistor are connected to the current source by means of resistors.

3. A signal aliasing cell designed to receive four voltages varying as a function of an analog signal Vin, the voltages varying as a function of Vin in phase opposition, two by two, and in phase quadrature, two by two, this cell giving at least two aliased output signals varying in phase opposition and having more aliasings than the input voltages for one and the same variation of Vin, the cell comprising:

at least one aliasing circuit comprising two pairs of differential arms, powered by one and the same current source connected to a first power supply terminal source, each pair comprising two transistors, the transistors of one pair being parallel-connected with the transistors of the other pair, each group of two parallel-connected transistors being connected by a respective common resistor to a second power supply terminal, the two outputs of the aliasing circuit being the combined collectors of the two groups of parallel-connected transistors, wherein the bases of the four transistors receive the four voltages varying as a function of the analog signal Vin.

4. A signal aliasing cell according to claim 3, wherein the two transistors of a different pair receive two voltages varying in phase quadrature and the two transistor receive the other two voltages varying in phase quadrature.

5. A signal aliasing cell according to claim 3, comprising another signal aliasing circuit receiving two outputs of a first current combination circuit and two outputs of a second current combination circuit at its four inputs, each current combination circuit comprising two differential pairs, each supplied with power by a respective current source and having common collector resistors, one of the pairs receiving inputs that are two input voltages varying in phase opposition and the other pair receiving inputs that are the other two voltages varying in phase quadrature, the output of the current combination circuit being taken at the collector resistors of the two differential pairs.

6. A cell according to claim 5 wherein, since the collector resistors are connected to the second terminal, a shift diode is wired between these resistors and this terminal.

7. A cell according to claim 5, wherein the transistors of the differential pairs are connected to the current sources by an emitter transistor.

8. A cell according to claim 3, comprising another signal aliasing circuit receiving at its four inputs, the four outputs of a circuit comprising four pairs of series-connected resistors, a connection point between the two resistors of each pair forming the outputs, a connection point between each pair that forms the inputs receiving the voltages varying as a function of the analog signal, the voltages varying in phase opposition being separated by two pairs of resistors and the voltages varying in quadrature being separated by one pair of resistors.

9. A cell according to claim 8, wherein the resistors have the same value.

10. An interpolation cell for an interpolation analog-digital converter comprising an aliasing cell according to claim 3.

* * * * *